United States Patent
Molstad

(10) Patent No.: US 6,754,022 B1
(45) Date of Patent: Jun. 22, 2004

(54) HIGH-SPEED CURRENT DRIVER

(75) Inventor: Richard W. Molstad, St. Paul, MN (US)

(73) Assignee: Imation Corp., Oakdale, MN (US)

( * ) Notice: Subject to any disclaimer, the term of this patent is extended or adjusted under 35 U.S.C. 154(b) by 366 days.

(21) Appl. No.: 09/906,187

(22) Filed: Jul. 16, 2001

(51) Int. Cl.$^7$ ................................................ G11B 5/02
(52) U.S. Cl. ........................................ 360/68; 327/110
(58) Field of Search ............................. 360/68, 46, 67; 327/110; G11B 5/09, 5/02

(56) References Cited

U.S. PATENT DOCUMENTS

| | | |
|---|---|---|
| 3,665,118 A | 5/1972 | Cooper, Jr. |
| 3,686,649 A | 8/1972 | Behr |
| 4,007,493 A | 2/1977 | Behr et al. |
| 4,149,198 A | 4/1979 | Behr et al. |
| 4,321,634 A | 3/1982 | Lehureau |
| 4,347,534 A | 8/1982 | Kimura |
| 4,454,549 A | 6/1984 | Pennington |
| 4,472,750 A | 9/1984 | Klumpp et al. |
| 4,498,129 A | 2/1985 | Velazquez |
| 4,549,232 A | 10/1985 | Axmear et al. |
| 4,586,094 A | 4/1986 | Chambors et al. |
| 4,587,579 A | 5/1986 | Cocke et al. |
| 5,003,412 A | 3/1991 | Bizjak et al. |
| 5,055,951 A | 10/1991 | Behr |
| 5,119,248 A | 6/1992 | Bizjak et al. |
| 5,132,861 A | 7/1992 | Behr et al. |
| 5,223,994 A | 6/1993 | Behr et al. |
| 5,293,281 A | 3/1994 | Behr et al. |
| 5,689,384 A | 11/1997 | Albrecht et al. |
| 5,739,706 A * | 4/1998 | Okamoto ..................... 327/110 |
| 5,822,141 A * | 10/1998 | Chung et al. .................. 360/46 |
| 5,930,065 A | 7/1999 | Albrecht et al. |
| 5,995,315 A | 11/1999 | Fasen |
| 6,021,013 A | 2/2000 | Albrecht et al. |
| 6,154,330 A | 11/2000 | Nakagawa |
| 6,169,640 B1 | 1/2001 | Fasen |
| 6,282,044 B1 * | 8/2001 | Teterud et al. ................ 360/68 |
| 6,404,574 B1 * | 6/2002 | Barnett ........................ 360/46 |
| 6,512,645 B1 * | 1/2003 | Patti et al. .................... 360/46 |
| 6,525,896 B2 * | 2/2003 | Chung et al. .................. 360/68 |

FOREIGN PATENT DOCUMENTS

| | | |
|---|---|---|
| EP | 0 690 442 A3 | 1/1996 |
| EP | 0 690 442 A2 | 1/1996 |

* cited by examiner

*Primary Examiner*—David Hudspeth
*Assistant Examiner*—Dan I. Davidson
(74) *Attorney, Agent, or Firm*—Eric D. Levinson

(57) ABSTRACT

The present invention provides techniques for generating an intense magnetic pulse very quickly. The present invention includes a device that drives high current through a write head, which generates a burst of magnetic flux that in turn generates a high-intensity fringing field. To rapidly build up the current through the write head, the write head is coupled to a high voltage source. A switching circuit prevents current from flowing in the write head. In response to a signal from a control circuit, the switching circuit provides a path for current to flow through the write head. Current flow through the write head rises rapidly, which causes a burst of magnetic flux and generates a high-intensity magnetic fringing field. The high-intensity fringing field may be used to write to a magnetic medium.

31 Claims, 4 Drawing Sheets

HIGH-SPEED CURRENT DRIVER

TECHNICAL FIELD

The invention relates to devices for driving current through inductive elements, and in particular, to devices that drive current through write heads that write to magnetic storage media.

BACKGROUND

Magnetic storage media, which include magnetic tape and magnetic disks, are used for storage and retrieval of data. Data may be read from or written to a magnetic medium with a read/write head assembly, which includes one or more transducer heads. The data are encoded in magnetizations on the recording surface.

The data stored on the magnetic medium are usually organized into "data tracks," and the transducer heads write data to and/or read data from the data tracks. A typical magnetic storage medium includes several data tracks.

As the number of data tracks on a medium increases, the data storage capacity of the medium increases. The data tracks also usually become narrower, as more data tracks are crowded onto the recording surface of the medium.

For proper data storage and recovery, a transducer head must locate each track where data are to be written or read, and follow the path of the data track accurately along the surface of the medium. A servo control system typically is provided to control the positioning of the head relative to the data tracks.

One technique used to position the head relies upon servo position information at pre-selected sites on the medium. This servo position information, which is usually recorded during the medium manufacturing process, is then used by the servo control system to control head motion when seeking between tracks, and to regulate head position on a track during reading and/or writing.

One format for storing servo position information is a time-based format. Unlike a conventional servo track format, which stores servo data as magnetic flux transitions of varying phases or frequencies, time-based servo marks store servo data in a series of patterns of marks. Typical patterns include a diamond or zigzag. Time-based servo marks are usually of a very short duration, and consequently consume less space on the recording surface than servo tracks.

SUMMARY

Because time-based servo marks are of a very short duration, the marks usually are recorded with an intense magnetic pulse that is quickly generated and quickly dissipated. The present invention provides techniques for generating an intense magnetic pulse very quickly. The present invention includes a device that drives a pulse of high current through a write head, which generates a burst of magnetic flux that in turn generates a high-intensity fringing field. The high-intensity fringing field may be used to write time-based servo marks on a magnetic medium.

The inductance of the write head prevents instantaneous high current flow through the write head. To rapidly build up the current through the write head, the write head is coupled to a high voltage source. A switching circuit holds both terminals of the write head at the high voltage supplied by the high voltage source, preventing current from flowing in the write head. In response to a signal from a control circuit, the switching circuit provides a path for current to flow through the write head. As a result, the voltage at one of the terminals of the write head rapidly drops. Current flow through the write head rises rapidly, which causes a burst of magnetic flux and generates a high-intensity magnetic fringing field.

The current pulse is usually of short duration. In response to a signal from a control circuit, the switching circuit opens the current path, preventing current from flowing through the switching circuit. The current flowing in the write head, no longer having a path through the switching circuit, dissipates in dissipating circuit elements. The current in the write head and the magnetic flux drop rapidly.

In one embodiment, the invention presents a device comprising a write head and a switching circuit. When the switching circuit is in a conducting state, current is allowed to flow through the write head. When the switching circuit is in a non-conducting state, current ordinarily does not flow through the write head. The device may include a high-voltage dc source coupled to the write head and a control circuit that regulates the states of the switching circuit.

In another embodiment, the invention presents a method comprising supplying a high voltage to a first terminal of a write head and holding a second terminal of the write head at the high voltage. While the second terminal is held at the high voltage, no current flows through the write head. The method further comprises dropping the voltage at the second terminal of the write head to cause current to flow through the write head. Because of the inductance of the write head, the current in the write head cannot cease flowing immediately. Accordingly, the method also includes dissipating the current with a dissipative element such as a resistor.

In a further embodiment, the invention presents a method comprising generating a controlling pulse, and opening and closing a switch as a function of the controlling pulse. The method further comprises driving current through a write head when the switch is closed and dissipating the current with a dissipative element when the switch is open.

In an additional embodiment, the invention comprises a device that includes a voltage source, a write head, a damping resistor in parallel with the write head, a dissipating resistor, a diode, a switching circuit and a control circuit that generates a control signal. The switching circuit is in either a conducting state or a non-conducting state as a function of the control signal. When the switching circuit is in a conducting state, current flows through the write head.

The details of one or more embodiments of the present invention are set forth in the accompanying drawings and the description below. Other features, objects, and advantages of the present invention will be apparent from the description and drawings, and from the claims.

DETAILED DESCRIPTION

Figure 1:
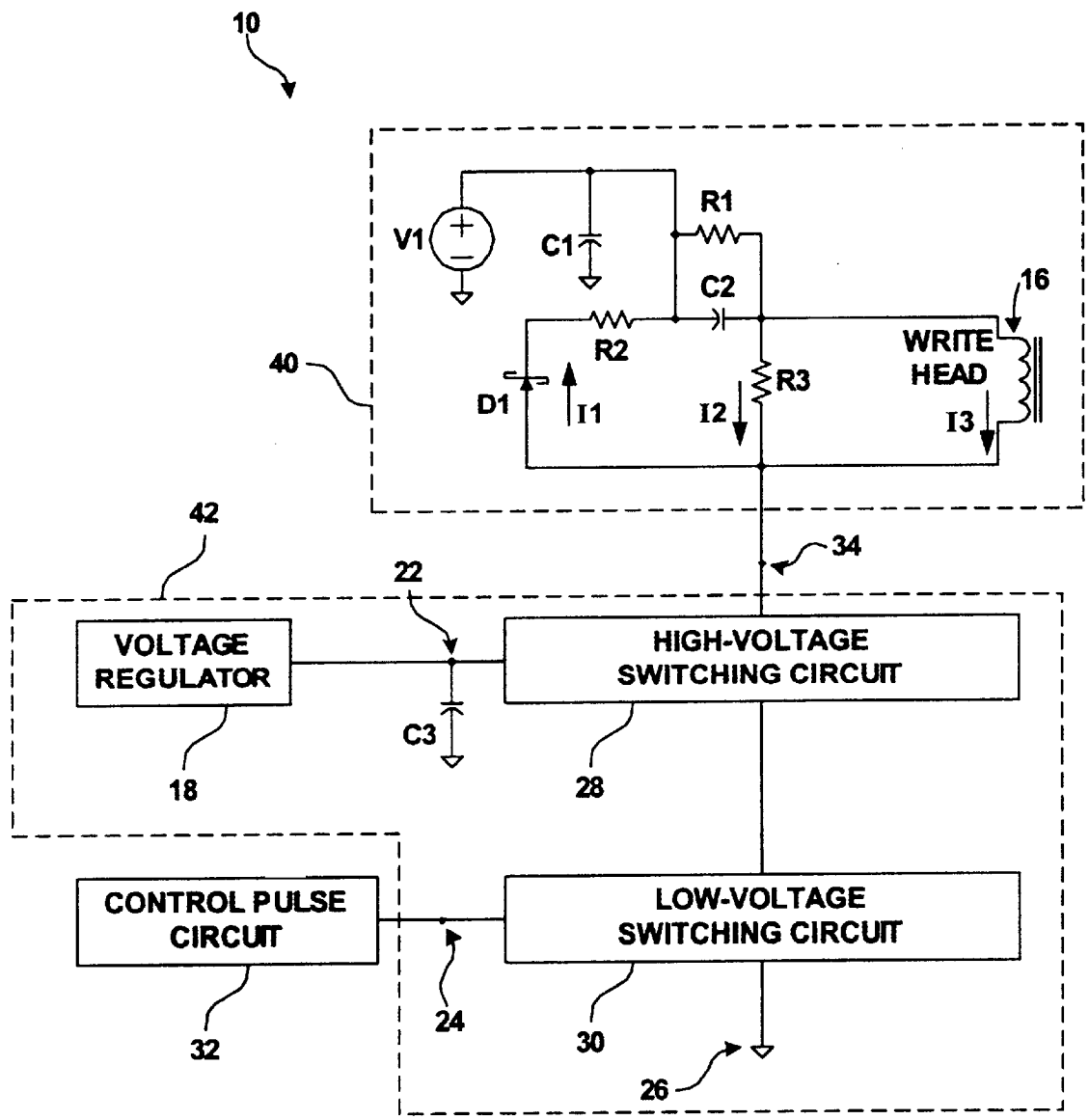
FIG. 1 is a block and circuit diagram of a high-speed current driver.

FIG. 1 is a block and circuit diagram of high-speed current driver 10. Driver 10 comprises writing circuit 40, which includes write head 16, and switching circuit 42. When write head 16 is energized, driver 10 rapidly produces current I3 through write head 16, and when write head is de-energized, driver 10 rapidly dissipates current I3. Switching circuit 42 controls the energizing and de-energizing of write head 16.

Write head 16 is an electromagnet. Write head 16, like a typical write head, may include a ferromagnetic C-shaped core wrapped with wire. When current I3 flows through the wire, magnetic flux flows through the core, and a fringe magnetic field forms in the gap of the core. The fringing field penetrates the magnetic medium as the medium passes the head, resulting in residual magnetization of the medium. The medium magnetically records the effect of the flux.

The magnitude of current I3 ordinarily does not encode a signal. Rather, current I3 is a pulse of short duration and high intensity. The pulse of current I3 results in a burst of magnetic flux and an intense fringing field that may record a short-duration magnetic mark on the medium.

A fringing field may be used to record a pattern or mark on the magnetic medium, such as a diamond or zigzag. Write head 16 may include gaps substantially in the shape of the pattern on the surface of the head. The gaps may be formed with great precision using photolithographic methods or other techniques. When current I3 flows and write head 16 is energized, the fringing field affecting the medium is shaped by the gaps. In this manner, the magnetic marks recorded on the medium follow the pattern of the gaps. A brief and intense burst of magnetic flux is often useful to avoid lengthening or "smearing" of the marks and to overcome the writing inefficiencies of write head 16.

This recording technique is well-suited for recording time-based servo marks. Time-based servo marks are usually of the very short duration and ought to be recorded with precision and without smearing. For a typical servo mark, the duration of a current pulse can range from 20 ns to 400 ns.

To generate an intense magnetic burst from write head 16, a current pulse is driven through write head 16. Because of the inductive qualities of write head 16, however, abrupt changes in the current can be difficult to achieve at low voltage levels. Driver 10 produces rapid changes in current I3 through write head 16 with high voltage, supplied by high-voltage source V1.

High-voltage source V1 supplies a constant dc voltage in the range of 90 V to 120 V. Voltages above and below this range may also work well. It will be assumed that high-voltage source V1 supplies 100 V, with the understanding that the invention is not limited to this voltage level. Capacitor C1 acts as a filter to help assure that the high supply voltage remains constant. Although the voltage supplied by high-voltage source V1 is constant at 100 V, the current supplied by high-voltage source V1 varies with the state of write head 16.

Write head 16 has two steady states. In the de-energized steady state, current I3 through write head 16 is zero. Consequently, there is no magnetic field generated by write head 16 in the de-energized state.

In the energized steady state, current I3 is of high amperage, such as 1 A to 4 A. Current amplitudes above and below this range may also work well, depending upon the construction of the head and the recording characteristics of the medium. For purposes of illustration, it will be assumed that the maximum value of I3 is 3 A, but the invention is not limited to this current level. In this energized steady state, write head 16 generates intense magnetic flux and an intense fringing field. When current I3 is 3 A, with a duration of 20 ns to 400 ns, the resulting magnetic field can produce substantially rectangular, unidirectional recording pulses suitable for generating time-based servo marks.

In addition to the steady states, write head 16 goes through two transitional periods. Write head 16 undergoes a first transition from the de-energized state to the energized state, and a second transition from the energized state to the de-energized state.

Switching circuit 42 drives write head 16 from the de-energized steady state to the energized steady state, and also drives write head 16 from the energized steady state to the de-energized steady state. Switching circuit 42 drives write head to a particular state by governing the voltage at node 34 and the currents flowing through node 34.

When write head 16 is in the de-energized state, currents I1, I2 and I3 are zero, and the voltage at node 34 is equal to 100 V. Although node 34 couples writing circuit 40 to switching circuit 42, switching circuit 42 is in an "off" or "non-conducting" state, i.e., switching circuit 42 behaves like an open circuit and offers no current path to ground 26. As a result, no current flows into or out of node 34, and switching circuit 42 holds the voltage at node 34 at 100 V.

Figure 2:
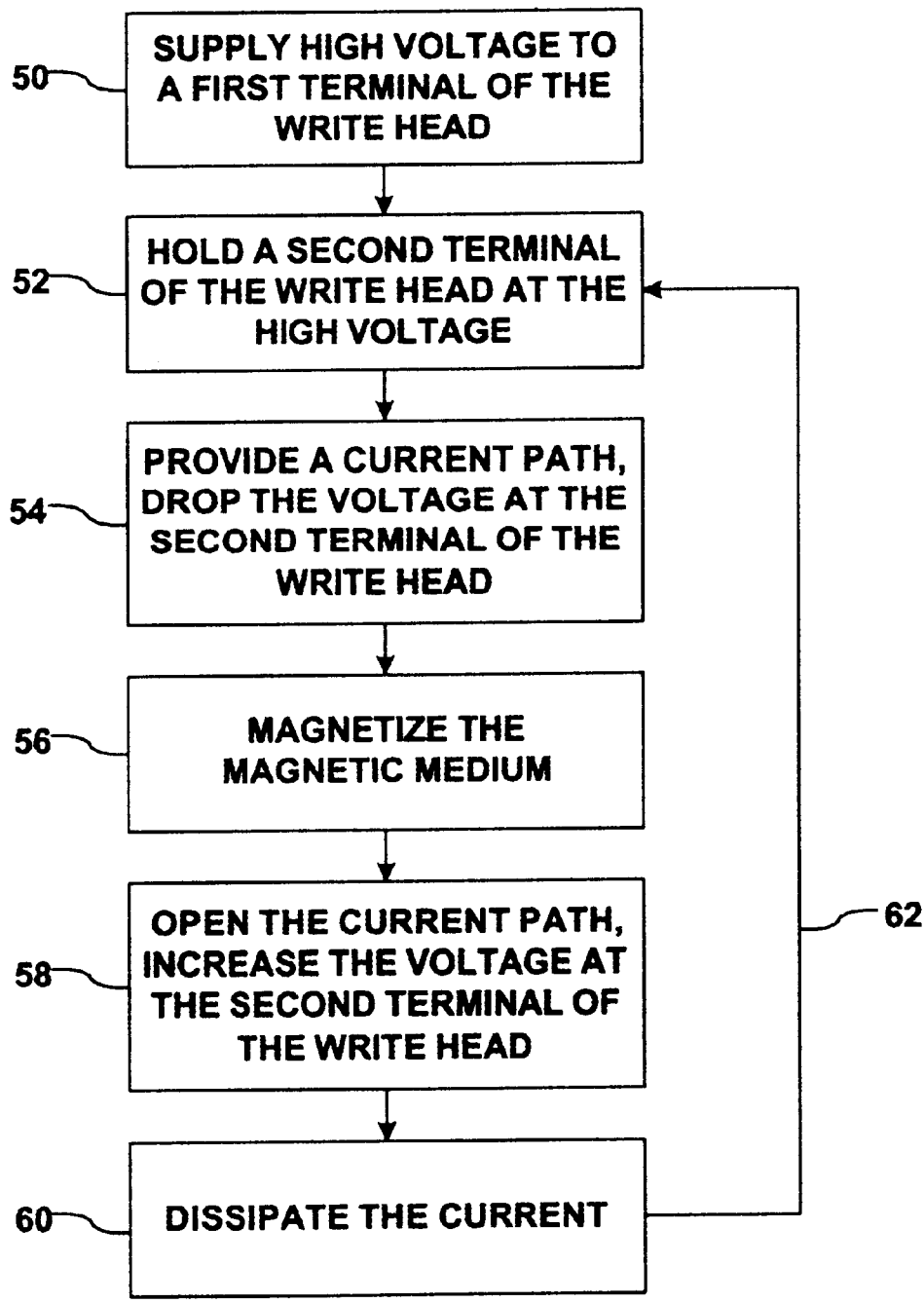
FIG. 2 is a flowchart showing a process for rapidly driving current through a write head.

FIG. 2 illustrates a method for marking a magnetic medium by driving write head 16 into an energized state, and then returning write head 16 to a de-energized state. Most of the time, write head 16 is in the de-energized state. In the de-energized state, one terminal of write head 16 is held to 100 V by the coupling of write head 16 to high-voltage source V1 (50). Switching circuit 42 holds the other end of write head 16, coupled to node 34, to the same high voltage (52) by providing no path for current to flow.

Switching circuit 42 drives write head 16 into an energized state by entering an "on" or "conducting" state, thereby providing a current path, i.e., closing a path to ground 26. As a result, current begins to flow through write head 16 and the voltage at node 34 drops rapidly (54). Write head 16 rapidly transitions into an energized state. When in the energized state, write head 16 generates a magnetic field that may magnetize a magnetic medium (56) passed in proximity to the field.

Switching circuit 42 drives write head 16 into a de-energized state by returning to the non-conducting state and opening the current path, thereby preventing current from flowing through switching circuit 42. Current flowing through inductive write head 16 continues to flow, however, and the voltage at node 34 jumps briefly to 200V (58). Instead of flowing through switching circuit 42, the current from write head 16 turns on Schottky diode DI and dissipates in dissipative elements, i.e., resistors R1 and R2.

In other words, switching circuit 42 may assume one of two states: conducting and non-conducting. When switching circuit 42 enters a conducting state (54), high-voltage source V1 drives write head 16 into an energized state. When switching circuit 42 circuit enters a non-conducting state (58), resistors R1 and R2 bring write head 16 back to a de-energized state.

Switching circuit 42 may include high-voltage switching circuit 28 and low-voltage switching circuit 30. Use of high- and low-voltage switching circuits 28 and 30 entails advantages such as straightforward management of energy dissipation. The state of switching circuit 42 is a function of the states of high-voltage switching circuit 28 and low-voltage switching circuit 30.

The state of high-voltage switching circuit 28 is controlled by low-voltage switching circuit 30, which in turn is controlled by control pulse circuit 32. Control pulse circuit 32 may be any one of a number of circuits that generate pulses of a desired frequency and pulse width. Typical pulses may have a duty cycle of less than three percent, which reduces the risk of overloading the circuit elements, which would cause the circuit elements to overheat and become damaged.

The pulse supplied to control node 24 may either be "low," e.g., zero volts, or "high," e.g., 3 V to 5 V. The "high" voltage supplied by control pulse circuit 32 is considerably less than the high voltage supplied by high-voltage source V1.

Low-voltage switching circuit 30 may assume one of two states: conducting and non-conducting. When the voltage at control node 24 is "low," low-voltage switching circuit 30 is in a non-conducting state. When low-voltage switching circuit 30 is in a non-conducting state, low-voltage switching circuit 30 does not conduct current from high-voltage switching circuit 28. As a result, high-voltage switching circuit 28 likewise is in a non-conducting state, and therefore switching circuit 42 is in a non-conducting state.

When the voltage at control node 24 is "high," low-voltage switching circuit 30 enters a conducting state, in which low-voltage switching circuit 30 conducts current from high-voltage switching circuit 28. This causes high-voltage switching circuit 28 to enter a conducting state as well. As a result, switching circuit 42 is driven into a conducting state.

Figure 3:
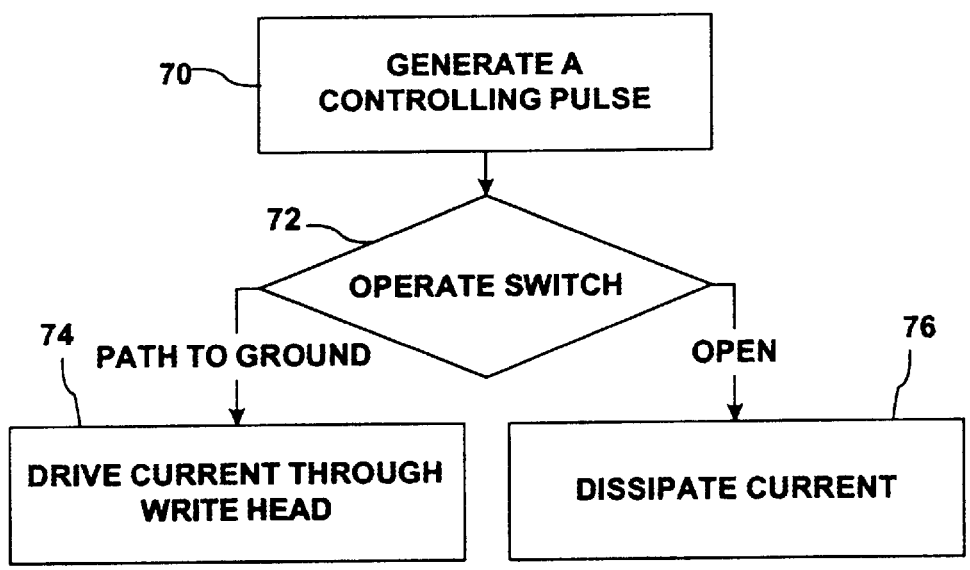
FIG. 3 is a flowchart showing a process for controlling a write head with a control pulse.

FIG. 3 is a flowchart illustrating techniques for controlling current flow through write head 16. When control pulse circuit 32 generates a control pulse (70), the voltage at control node 24 goes from a "low" voltage to a "high" voltage, causing low-voltage switching circuit 30 and high-voltage switching circuit 28 to assume a conducting state. Consequently, switching circuit 42 enters a conducting state (72). When switching circuit 42 enters a conducting state, switching circuit 42 provides a path to ground 26, and switching circuit 42 conducts current from writing circuit 40 via node 34. High-voltage source V1 causes high current to flow, driving write head 16 into an energized state. In this manner, a low-voltage control pulse applied at node 24 causes high current to flow though write head 16 (74).

When switching circuit 42 enters a conducting state, the voltage at node 34 drops and current I2 flows through damping resistor R3. Current I3 also begins to flow through write head 16. Current I1 remains zero because of Schottky diode D1.

Current I3 rapidly rises to a current of 3 A. A typical rise time is about 10 ns. The short rise time is due, in part, to the high voltage supplied by high-voltage source V1. The shape of the current pulse is a function of the inductance of write head 16, the resistance of damping resistor R3 and other impedance seen by write head 16. Typical write heads include coils having inductances of about 1 to 2 $\mu$pdH. Damping resistor R3 is chosen to optimize the shape of the current pulse, e.g., to reduce overshoot and ringing.

Write head 16 enters the energized state. During the energized state, switching circuit 42 conducts current and dissipates energy. Resistor R1 and capacitor C2 reduce the energy dissipation in switching circuit 42, yet R1 and C2 do not affect the rise time as write head 16 transitions from the de-energized state to the energized state. A typical value for R1 is 20Ω, and a typical value for C2 is 0.01 $\mu$F (at 500 V).

Referring again to FIG. 3, when the control pulse applied at control node 24 terminates, low-voltage switching circuit 30 and high-voltage switching circuit 28 assume non-conducting states, i.e., switching circuit 42 enters the non-conducting state (72). As a result, switching circuit 42 opens the path to ground 26. Currents I2 and I3 can no longer flow from writing circuit 40 to switching circuit 42. Current I3 flowing through write head 16 cannot stop instantaneously because of the inductance of write head 16. The energy stored in write head 16 is a function of I3 squared and the inductance of write head 16, and this energy must be dissipated (76).

With no path available through switching circuit 42, current flowing through write head 16 turns on Schottky diode D1, and current I1 flows through D1. The energy stored in write head 16 is then dissipated by resistors R2 and R1. A typical value for R2 is 150Ω. Current I3 rapidly drops to zero, and write head 16 enters the de-energized state.

Figure 4:
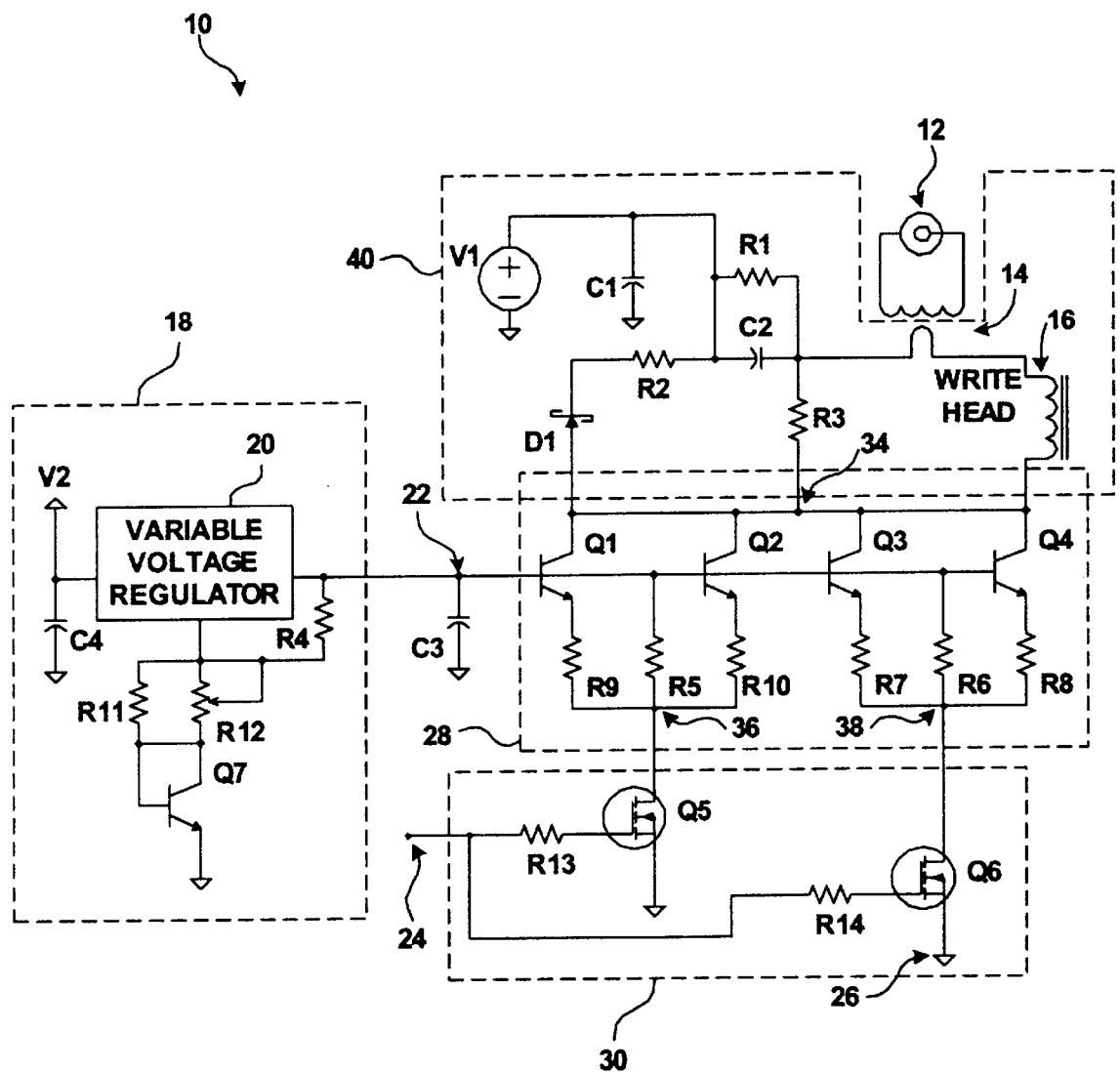
FIG. 4 is a circuit diagram of the high-speed current driver.

FIG. 4 is a more detailed circuit diagram of driver 10. Low voltage switching circuit 30 comprises switching transistors Q5 and Q6. As shown in FIG. 4, Q5 and Q6 are controlled by a single control voltage applied at control node 24. When a "low" voltage, i.e., a voltage below the threshold voltage, is applied at control node 24, Q5 and Q6 behave as open circuits. When a "high" voltage, i.e., a voltage above the threshold voltage, is applied at control node 24, Q5 and Q6 allow current to flow to ground 26. Q5 and Q6 are shown in FIG. 4 as n-channel metal-oxide semiconductor field effect transistors (MOSFETs), but Q5 and Q6 may be any other component having rapid switching capability. Optional resistors R13 and R14 provide connection to control pulse circuit 32 (not shown in FIG. 4) and control the turn-on and turn-off times of Q5 and Q6. R13 and R14 may have values of 10Ω, for example.

The sources of Q5 and Q6 are at ground potential 26. For reasons that will be discussed in more detail below, the maximum voltage at the drains of Q5 and Q6 is the voltage at regulated voltage node 22. Accordingly, Q5 and Q6 can be any of several low-voltage FETs. High-voltage switching circuit 28 can be controlled with a single field effect transistors (FET) or with more than two FETs.

High-voltage switching circuit 28 comprises high speed, high-voltage bipolar junction transistors Q1, Q2, Q3 and Q4. Switching transistor Q5 controls Q1 and Q2, and switching transistor Q6 controls Q3 and Q4. Zetex™ ZTX1056A high-gain transistors, available commercially from Zetex plc of Oldham, UK, may serve as transistors Q1, Q2, Q3 and Q4. Zetex ZTX1056A transistors are rated for high speed (transition frequency of approximately 120 MHz) and are rated for a continuous collector current of 3 A. Other models of transistors also may be used.

The base voltages of transistors Q1, Q2, Q3 and Q4 are regulated, each base being held at the regulated voltage at node 22. A typical voltage at regulated voltage node 22 is 8 V, but other voltage magnitudes may also work well.

Voltage regulator 18 comprises variable voltage regulator 20, such as an LM317LZ, powered by voltage supply V2. V2 may supply, for example, 12 V dc, and V2 may be initially filtered by 0.22 $\mu$F capacitor C4. Resistors R4, R11 and R12 are chosen to set the regulated voltage at node 22. Other voltage regulators may employ different arrangements of circuit components to set a desired voltage.

Transistor Q7 provides some degree of temperature compensation of the regulated voltage. Transistor Q7 is of the same type as transistors Q1, Q2, Q3 and Q4, and is in close thermal contact with transistors Q1, Q2, Q3 and Q4.

When Q5 and Q6 are non-conducting, resistors R5 and R6 (each with a typical value of 51.1Ω) cause the voltages at nodes 36 and 38 to be equal to the voltage at regulated voltage node 22. As a result, the emitter voltages of transistors Q1, Q2, Q3 and Q4 become equal to the transistors' base voltages, the base currents drop to zero, and the transistors are driven into a cut-off state, i.e., a non-conducting state. The collector voltages of transistors Q1, Q2, Q3 and Q4, however, remain at 100 V. Transistors Q1, Q2, Q3 and Q4 remain cut off as long as Q5 and Q6 are non-conducting.

When a "high" voltage is applied at control node 24, Q5 and Q6 allow current to flow to ground 26. As a result, the voltages at nodes 36 and 38 are pulled down, causing transistors Q1, Q2, Q3 and Q4 to exit the cut-off state and to conduct current. The emitter current through transistors Q1, Q2, Q3 and Q4 is a function of each transistor's base voltage, each transistor's base-to-emitter voltage, emitter resistors R9, R10, R7 and R8 (each with a typical value of 10Ω), and the on-resistance of FETs Q5 and Q6. For a constant voltage at regulated voltage node 22, the emitter current will principally be a function of emitter resistors R9, R10, R7 and R8, with a small error from the temperature-dependent base-to-emitter voltages. Transistor Q7 compensates to some extent for this temperature-dependent error.

When transistors Q1, Q2, Q3 and Q4 begin to conduct current, the resistance seen at node 34 looking into switching circuit 42 drops from a practically infinite value to about 2.5Ω. As a result, the transistors' collector voltage, i.e., the voltage at node 34, begins to drop rapidly. Current immediately flows in damping resistor R3 and current rises rapidly in write head 16. As noted above, R1 dissipates some of the energy that would ordinarily be dissipated by transistors Q1, Q2, Q3 and Q4.

Capacitor C2 contributes to the speed at which current I3 builds up in write head 16. When switching circuit 42 enters a conducting state, capacitor C2 holds the voltage high at one terminal of write head 16, thereby driving current I3 through write head 16. Capacitor C2 thereafter charges while some of the energy is dissipated in R1.

When a "low" voltage is applied at control node 24, Q5 and Q6 behave as open circuits. As a result, transistors Q1, Q2, Q3 and Q4 are driven into a cut-off state. The direction of positive flow of current 12 instantly reverses, and the transistors' collector voltages, i.e., the voltage at node 34, jumps to 200 V. The current flowing through node 34 quickly declines as the energy stored in write head 16 is dissipated by R1 and R2, and the voltage at node 34 falls to 100 V.

Although four transistors Q1, Q2, Q3 and Q4 are shown in FIG. 4, high-voltage switching circuit 28 may include more or fewer transistors. Using more transistors may affect the speed of transition between states, and using fewer transistors may require each transistor to dissipate more energy.

A number of embodiments of the present invention have been described. Nevertheless, various modifications may be made without departing from the scope of the invention. Variations of write heads may necessitate some calibration of driver 10, and many values of resistors or other components given above may be adjusted to improve performance. One useful tool for calibration is current monitor 12, inductively coupled to writing circuit 40 by transformer 14. Measurements of I3 taken with current monitor 12 may be useful in calibrating driver 10.

The topology of the circuit elements may be changed without departing from the scope of the invention. For example, dissipating resistor R2 and diode D1 are in series, and the order of these components may be reversed without changing the operation of the driver.

Some circuit elements can be combined without departing from the scope of the invention. It may be possible, for example, to combine the functions of low-voltage switching circuit 30 and high-voltage switching circuit 28 in a single circuit. Although there may be advantages to employing separate circuits, the invention does not require switching circuit 42 to include separate low-voltage and high-voltage switching circuits to control the voltage at node 34 and to respond to control pulses from control pulse circuit 32.

In addition, it may be possible to construct switching circuit 42 or high-voltage switching circuit 28 without any need for voltage regulator 18. The invention does not require voltage regulator 18.

The invention has been described according to the states of various components. It is understood that the invention is not limited to the particular arrangements of states described above. Driver 10 may be modified, for example, to drive low-voltage switching circuit 30 into a non-conducting state when a "high" voltage is applied at control node 24 and into a conducting state when a "low" voltage is applied at control node 24.

Furthermore, driver 10 may be employed for writing servo marks to magnetic media, but the invention is not limited to such a use.

These and other embodiments are within the scope of the following claims.

What is claimed is:

1. A device comprising:

a voltage source that supplies a dc voltage to a high-voltage node;

a magnetic write head coupled to the high-voltage node;

a damping resistor coupled to the high-voltage node in parallel with the write head;

a dissipating resistor in series with a diode coupled to the high-voltage node, wherein the diode is oriented to conduct current from the write head to the light-voltage node;

a switching circuit coupled to the write head; and a control circuit coupled to the switching circuit, the control circuit generating a control signal, wherein the switching circuit is in one of a conducting state and a non-conducting state as a function of the control signal, and wherein current flows through the write head when the switching circuit is in a conducting state.

2. The device of claim 1, further comprising:

a second dissipating resistor; and a capacitor in parallel with the second dissipating resistor, wherein the second dissipating resistor and the capacitor are interposed between the write head and the high-voltage node.

3. The device of claim 1, wherein the diode is a Schottky diode.

4. The device of claim 1, wherein the voltage source supplies between 90 V and 120 V to the high-voltage node.

5. The device of claim 1, wherein the switching circuit comprises a first switching circuit coupled to a second switching circuit.

6. The device of claim 5, wherein the first switching circuit is in the conducting state when the second switching circuit is in the conducing state, and wherein the first switching circuit is in the non-conducting state when the first switching circuit is in the non-conducting state.

7. The device of claim 5, wherein the second switching circuit comprises a field effect transistor, the gate of the field effect transistor receiving the control signal and the drain of the field effect transistor coupled to the first switching circuit.

8. The device of claim 5, wherein the first switching circuit comprises:
   a bipolar junction transistor, the collector of the bipolar junction transistor being coupled to the write head;
   an emitter resistor coupled to the emitter of the bipolar junction transistor, and
   a base resistor coupled to the base of the bipolar junction transistor and to the emitter resistor.

9. The device of claim 8, wherein the emitter resistor and the base resistor are coupled to the second switching circuit.

10. The device of claim 8, further comprising a voltage regulator coupled to the base of the bipolar junction transistor, the voltage regulator supplying a constant dc voltage to the base of the bipolar junction transistor.

11. The device of claim 10, wherein the voltage regulator is adjustable, and wherein the voltage regulator includes a temperature-compensating bipolar junction transistor.

12. A device, comprising:
    a write head;
    a switching circuit coupled to the write head; and
    a dissipative element that receives current from the write head when the switching circuit is in a non-conducting state,
    wherein current flows through the write head when the switching circuit is in a conducting state.

13. The device of claim 12, wherein current does not flow through the write head when the switching circuit is in a non-conducting state.

14. The device of claim 12, wherein the dissipative element is a resistor.

15. The device of claim 12, further comprising a dc voltage source coupled to the write head.

16. The device of claim 15, wherein the dc voltage source supplies between 90 V and 120 V.

17. The device of claim 12, further comprising a control circuit coupled to the switching circuit,
    wherein the state of the switching circuit is one of the conducting state and a non-conducting state, and
    wherein the control circuit controls the state of the switching circuit.

18. The device of claim 17,
    wherein the switching circuit comprises a first switching circuit coupled to a second switching circuit,
    wherein the first switching circuit is in the conducting state when the second switching circuit is in the conducting state, and
    wherein the first switching circuit is in the non-conducting state when the second switching circuit is in the non-conducting state.

19. A method comprising:
    supplying a high voltage to a first terminal of a write head;
    holding a second terminal of the write head at the high voltage;
    dropping the voltage at the second terminal of the write head to cause current to flow through the write head;
    increasing the voltage at the second terminal of the write head; and
    dissipating the current.

20. The method of claim 19, wherein supplying a high dc voltage comprises supplying between 90 V dc and 120 V dc.

21. The method of claim 19, wherein dropping the voltage at the second terminal of the write head comprises providing a path for current to flow through the write head.

22. The method of claim 21, wherein increasing the voltage at the second terminal of the write head comprises opening the current path.

23. The method of claim 19, wherein dissipating the current comprises routing the current to a dissipative element.

24. A method comprising:
    supplying a high voltage to a first terminal of a write head;
    holding a second terminal of a write head at the high voltage;
    dropping the voltage at the second terminal of the write head to cause a current to flow through the write head and generate a fringing field; and
    passing a magnetic medium in proximity to the fringing field.

25. The method of claim 24, further comprising magnetizing the medium.

26. The method of claim 24, wherein the current flowing through the write head reaches a maximum current, and wherein the maximum current flowing through the write head is between 1 A and 4 A.

27. The method of claim 24, wherein the current flowing through the write head reaches a maximum current, and wherein the rise time of the current is approximately 10 ns.

28. The method of claim 24, further comprising forming at least one gap in the shape of the pattern on the surface of the write head.

29. A method comprising:
    generating a controlling pulse;
    opening and closing a switch as a function of the controlling pulse;
    driving current through a write head when the switch is closed; and
    dissipating the current when the switch is open, wherein the current through the write head reaches a maximum current between 1 A and 4 A.

30. A method comprising:
    generating a controlling pulse;
    opening and closing a switch as a function of the controlling pulse;
    driving current through a write head when the switch is closed; and
    dissipating the current when the switch is open,
        wherein the controlling pulse has a duty cycle of less than three percent.

31. A method comprising:
    generating a controlling pulse;
    opening and closing a switch as a function of the controlling pulse;
    driving current through a write head when the switch is closed; and
    dissipating the current when the switch is open,
        wherein driving current through the write head comprises supplying a high voltage to the write head between 90 V dc and 120 V dc.

* * * * *